US012700574B2

(12) United States Patent
Huderi Somanna et al.

(10) Patent No.: US 12,700,574 B2
(45) Date of Patent: Aug. 4, 2026

(54) HEAT SHIELD ASSEMBLIES FOR MINIMIZING HEAT RADIATION TO PUMP OF PROCESS CHAMBER

(71) Applicant: Applied Materials, Inc., Santa Clara, CA (US)

(72) Inventors: Dinkesh Huderi Somanna, San Jose, CA (US); Ala Moradian, San Jose, CA (US); Colin John Dickinson, San Jose, CA (US); Manjunath Subbanna, Bengaluru (IN)

(73) Assignee: APPLIED MATERIALS, INC., Santa Clara, CA (US)

( * ) Notice: Subject to any disclaimer, the term of this patent is extended or adjusted under 35 U.S.C. 154(b) by 1093 days.

(21) Appl. No.: 17/690,644

(22) Filed: Mar. 9, 2022

(65) Prior Publication Data

US 2023/0290614 A1     Sep. 14, 2023

(51) Int. Cl.
| | |
|---|---|
| *C23C 16/44* | (2006.01) |
| *C23C 14/34* | (2006.01) |
| *H01J 37/32* | (2006.01) |
| *H10P 72/00* | (2026.01) |

(52) U.S. Cl.
CPC ........ *H01J 37/32477* (2013.01); *C23C 14/34* (2013.01); *H01J 2237/332* (2013.01)

(58) Field of Classification Search
None
See application file for complete search history.

(56) References Cited

U.S. PATENT DOCUMENTS

| | | | | | |
|---|---|---|---|---|---|
| 4,267,707 | A | * | 5/1981 | Hemmerich | F04B 37/08 |
| | | | | | 428/137 |
| 4,336,690 | A | * | 6/1982 | Welch | F04B 37/08 |
| | | | | | 62/55.5 |
| 4,446,702 | A | * | 5/1984 | Peterson | F04B 37/08 |
| | | | | | 62/100 |
| 5,548,964 | A | * | 8/1996 | Jinbo | F04B 37/08 |
| | | | | | 62/55.5 |

(Continued)

FOREIGN PATENT DOCUMENTS

| | | |
|---|---|---|
| CN | 209212659 U | 8/2019 |
| GB | 2059512 | 4/1981 |

OTHER PUBLICATIONS

PCT International Search Report for PCT/US2023/014695 dated Jun. 29, 2023.

(Continued)

*Primary Examiner* — Sylvia Macarthur
*Assistant Examiner* — Michelle Crowell
(74) *Attorney, Agent, or Firm* — Moser Taboada

(57) ABSTRACT

Embodiments of heat shield assemblies for a processing chamber are provided herein. In some embodiments, a heat shield assembly for a processing chamber includes: a first shield comprising a circular plate; a second shield coupled to the first shield and in a parallel configuration with the first shield, wherein the second shield has an outer diameter greater than an outer diameter of the first shield and the second shield includes a central opening having a diameter smaller than an outer diameter of the first shield; and a third shield coupled to and in a parallel configuration with the second shield, wherein an outer diameter of the third shield is greater than the diameter of the central opening of the second shield.

20 Claims, 6 Drawing Sheets

(56)                    References Cited

U.S. PATENT DOCUMENTS

| | | | | |
|---|---|---|---|---|
| 5,782,096 A * | 7/1998 | Bartlett | .................. | F04B 37/08 |
| | | | | 62/55.5 |
| 6,361,273 B1 | 3/2002 | Eng et al. | | |
| 6,620,250 B2 | 9/2003 | Brezoczky et al. | | |
| 7,389,645 B2 * | 6/2008 | Ritchie | ................. | C23C 14/564 |
| | | | | 62/55.5 |
| 2002/0166632 A1 | 11/2002 | Brezoczky et al. | | |
| 2006/0037537 A1 | 2/2006 | Lombardi et al. | | |
| 2007/0084406 A1 | 4/2007 | Yudovsky et al. | | |
| 2007/0101733 A1 | 5/2007 | Ritchie et al. | | |
| 2020/0392950 A1 | 12/2020 | Mahoney et al. | | |

OTHER PUBLICATIONS

European Supplementary Search Report for EP 23767388, dated Mar. 3, 2026.

* cited by examiner

HEAT SHIELD ASSEMBLIES FOR MINIMIZING HEAT RADIATION TO PUMP OF PROCESS CHAMBER

FIELD

Embodiments of the present disclosure generally relate to substrate processing chambers.

BACKGROUND

Semiconductor substrate processing systems may perform a first and second stage pump down to produce a sufficient vacuum for processing semiconductor wafers in a process chamber. Generally, in the first stage, the chamber is evacuated and brought to a first vacuum level. After the bulk of the atmosphere has been removed from the chamber and a vacuum is established, the second stage is initiated. During the second stage, a cryogenic pump (commonly referred to as a cryo pump) is used to attain a high vacuum level within the process chamber.

Generally, the cryo pump develops a high vacuum within the chamber by removing molecules and other gases remaining in the chamber atmosphere after the first stage pump down. The cryo pump adsorbs gases when cold, then progressively loses the ability to adsorb gases as the cryo pump temperature increases, until reaching a temperature where the cryo pump desorbs gases. As such, the temperature of the pump directly effects the ability of the cryo pump to achieve and maintain high vacuum (i.e., the cryo pump must remain cool to efficiently achieve high vacuum).

Typically, the cryo pump is connected to a pump port in the process chamber via an elbow conduit. The elbow conduit functions to protect the cryo pump from heat generated in the chamber by lamps, pedestal heaters, plasma, and other heat sources within the chamber. The elbow conduit thermally "isolates" the cryo pump by placing the cryo pump at a distance from the chamber where the heating effects from the chamber are less severe. The pump port may be fitted with a shield to reflect radiant energy generated within the process chamber. However, a single shield may be insufficient to protect the cryo pump.

Therefore, the inventors have provided improved heat shield assemblies for shielding cryo pumps from thermal energy generated within processing chambers.

SUMMARY

Embodiments of heat shield assemblies for a processing chamber are provided herein. In some embodiments, a heat shield assembly for a processing chamber includes: a first shield comprising a circular plate; a second shield coupled to the first shield and in a parallel configuration with the first shield, wherein the second shield has an outer diameter greater than an outer diameter of the first shield and the second shield includes a central opening having a diameter smaller than an outer diameter of the first shield; and a third shield coupled to and in a parallel configuration with the second shield, wherein an outer diameter of the third shield is greater than the diameter of the central opening of the second shield.

In some embodiments, a heat shield assembly for a processing chamber includes a plurality of shields arranged in a parallel configuration, wherein a first shield of the plurality of shields comprises a circular plate, wherein a second shield of the plurality of shields has an outer diameter greater than an outer diameter of the first shield and the second shield includes a central opening having a diameter smaller than an outer diameter of the first shield.

In some embodiments, a processing chamber includes: a chamber body defining an interior volume therein, wherein the chamber body includes a pump port configured for coupling the chamber body to a cryogenic pump; a substrate support disposed in the interior volume and configured to support a substrate; and a heat shield assembly disposed in the interior volume proximate the pump port and substantially covering the pump port, the heat shield assembly comprising: a plurality of shields arranged in a parallel configuration, wherein a first shield of the plurality of shields comprises a circular plate, wherein a second shield of the plurality of shields has an outer diameter greater than an outer diameter of the first shield and the second shield includes a central opening having a diameter smaller than an outer diameter of the first shield.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
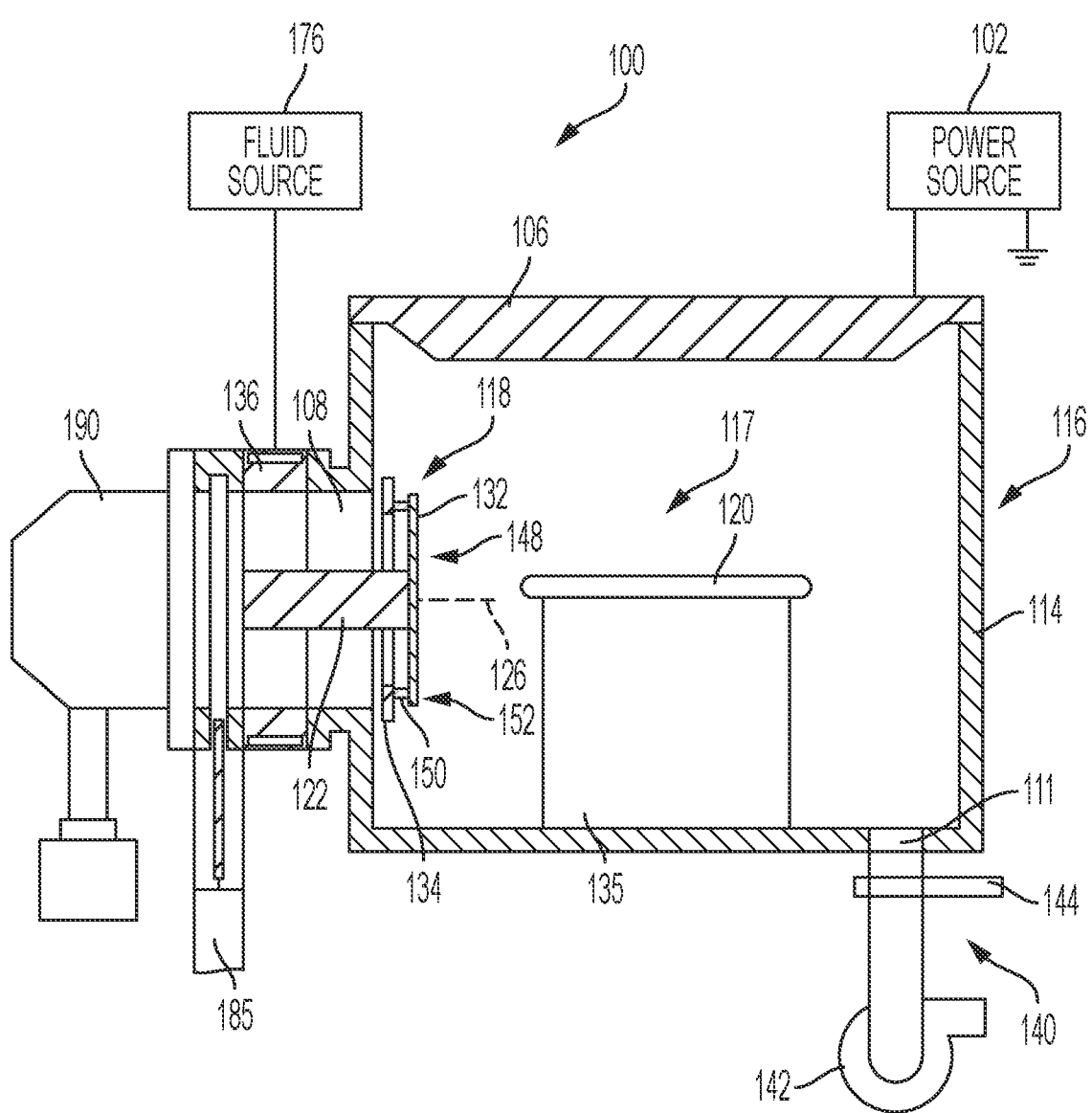
FIG. 1 depicts a schematic side view of a process chamber having a heat shield assembly in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of heat shield assemblies for use with processing chambers are provided herein. The embodiments of heat shield assemblies provided herein advantageously protect pumps, such as cryo pumps, of the processing chambers from heat generated from within the processing chambers while allowing sufficient flow conductance through pump ports of the processing chambers. A single heat shield, when heated, may radiate heat from a backside (i.e., side facing the cryo pump) to the cryo pump. As such, the heat shield assemblies provided herein generally comprise a plurality of shields arranged in a parallel configuration. One or more of the shields may be solid shields to block thermal radiation while one or more of the shields may have openings to provide flow conductance.

FIG. 1 depicts a process chamber 100 having a heat shield assembly 118 in accordance with at least some embodiments of the present disclosure. The heat shield assembly 118 effectively shields a device from thermal energy generated within a chamber body 116 of the process chamber 100. The heat shield assembly 118 is generally applicable to vacuum chambers of semiconductor wafer processing systems, including, for example, physical vapor deposition (PVD) or sputtering chambers, chemical vapor deposition (CVD) chambers, high temperature chambers (HTC), or any other chambers wherein thermal shielding of a device is desired.

FIG. 1 schematically illustrates a process chamber 100 that is a PVD chamber. The process chamber 100 comprises a pump 190, for example a cryo pump, and a rough pump assembly 140 coupled to a chamber body 116. The chamber body 116 includes a pump port 108 configured for fluidly coupling to the pump 190 to the chamber body 116. The chamber body 116 defines an interior volume 117 therein. The heat shield assembly 118 is disposed in the interior volume 117 proximate the pump port 108. A fluid source 176 may be coupled to the heat shield assembly 118 to cool the heat shield assembly 118 during use. In some embodiments, the heat shield assembly 118 substantially covers the pump port 108.

The chamber body 116 generally includes chamber walls 114 and a target plate 106. The target plate 106 is disposed on top of the chamber walls 114 and encloses interior volume 117. The target plate 106 may be electrically insulated from the chamber walls 114 by an annular insulator (not shown). Generally, to ensure the integrity of the vacuum in the chamber body 116, o-rings (not shown) are used above and below the annular insulator to provide a vacuum seal. The target plate 106 may be fabricated of a material that will become the deposition material or may contain a coating of the deposition material. To facilitate the sputtering process, a high voltage DC power supply 102 is connected between the target plate 106 and the chamber walls 114.

The chamber walls 114 and the target plate 106 define an interior volume 117. In some embodiments, the chamber walls 114 defines a second pump port 111 fluidly coupled to the rough pump assembly 140. The rough pump assembly 140 typically comprises a shut off valve 144 and a rough pump 142. The shut off valve 144 is coupled between the rough pump 142 and the second pump port 111. The shut off valve 144 is actuated to isolate the rough pump 142 from the interior volume 117, for example, when a first level of vacuum is reached within the process chamber 100.

The pump port 108 places the interior volume 117 in fluid communication with the pump 190. A shut off valve 185 is coupled between the pump port 108 and the pump 190. The shut off valve 185 isolates the pump 190 when the pump is not in use. A substrate support 135 is disposed in the interior volume 117 and configured to support and retain a substrate 120. The substrate support 135, that may be heated, is raised and lowered by a lift system (not shown) to position the substrate 120 relative to the target plate 106.

The heat shield assembly 118 includes a plurality of shields 148 arranged in a parallel configuration. The plurality of shields 148 are coupled to the chamber walls 114 proximate the pump port 108 in any suitable manner. In some embodiments, the heat shield assembly 118 further comprises an annular mounting flange 136 coupled to the chamber walls 114. The annular mounting flange 136 may be generally fabricated from a thermally conductive material, for example, copper or stainless steel. The annular mounting flange 136 generally comprises an annular ring configured to have the same or similar circumferential profile as the chamber opening, or the pump port 108, to which the annular mounting flange 136 is mounted. In some embodiments, the annular mounting flange 136 may be disposed in a parallel configuration with the plurality of shields 148.

In some embodiments, the plurality of shields 148 are coupled to the annular mounting flange 136 via a support member 122 extending from a central axis 126 of the annular mounting flange 136. The plurality of shields 148 includes a first shield 132 and a second shield 134. In some embodiments, the support member 122 is coupled to the first shield 132 and the first shield 132 is directly coupled to the second shield 134 along an outer peripheral region 152 of the first shield 132 via a plurality of fasteners 150. In some embodiments, the plurality of shields 148 are coupled to the chamber walls 114 without an annular mounting flange 136, for example, with a mounting bracket as shown and discussed below with respect to FIGS. 5 and 6.

Figure 2:
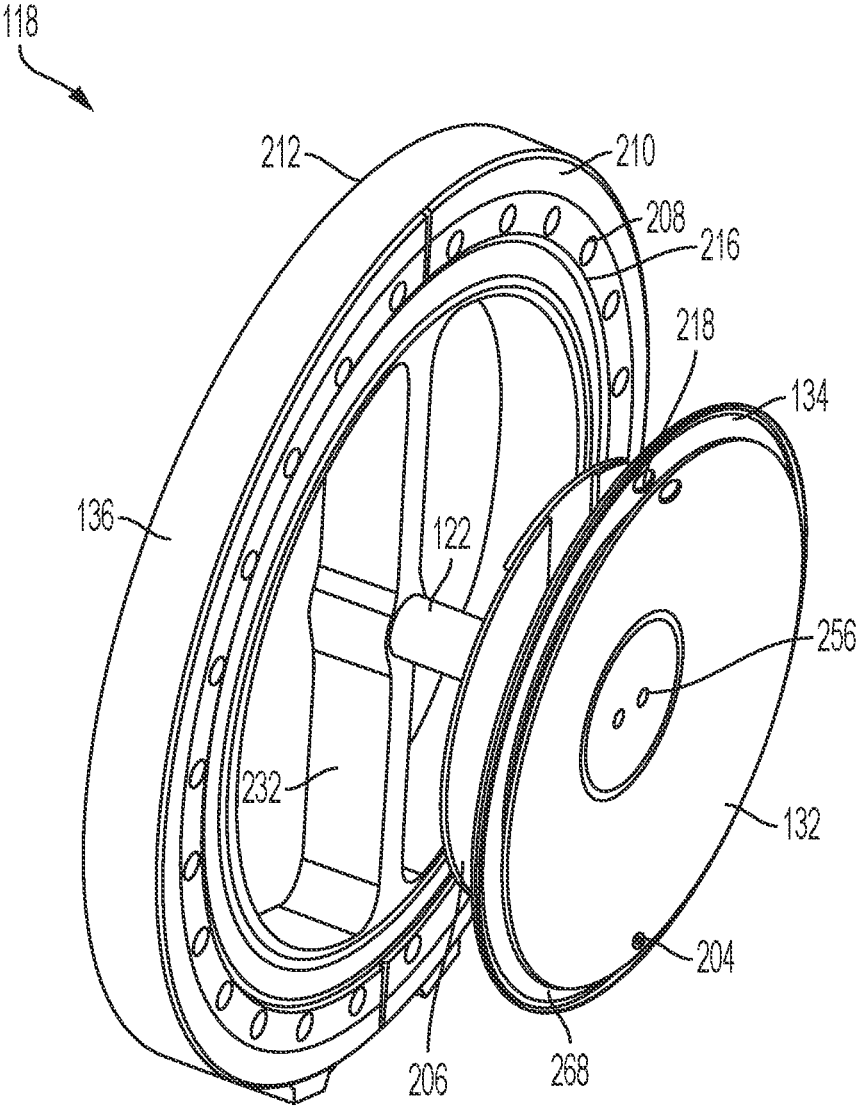
FIG. 2 depicts an isometric view of a heat shield assembly in accordance with at least some embodiments of the present disclosure.
Figure 3:
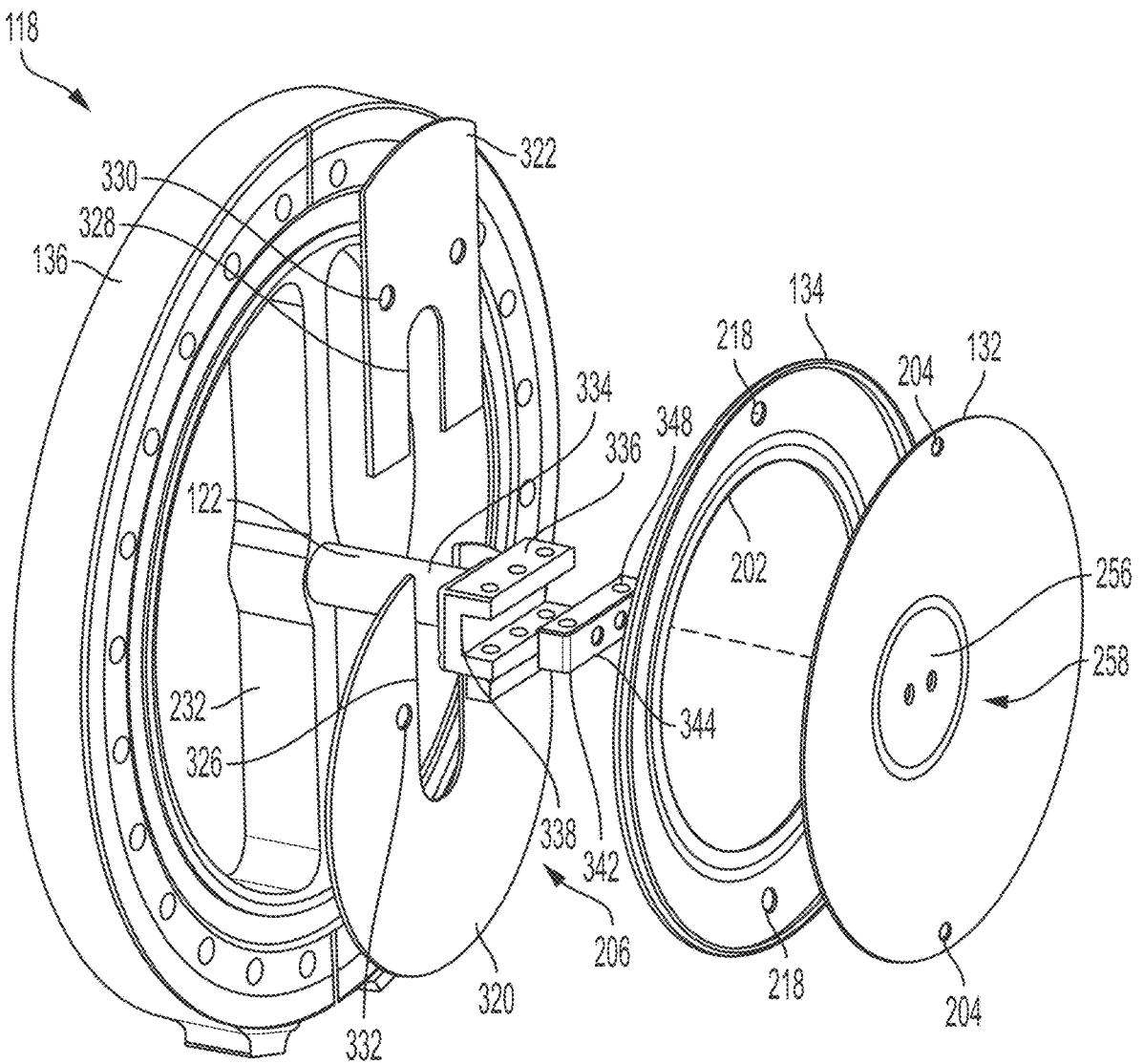
FIG. 3 depicts an exploded view of a heat shield assembly in accordance with at least some embodiments of the present disclosure.

FIG. 2 depicts an isometric view of a heat shield assembly 118 in accordance with at least some embodiments of the present disclosure. FIG. 3 depicts an exploded view of a heat shield assembly 118 in accordance with at least some embodiments of the present disclosure. The heat shield assembly 118, as depicted in FIGS. 2 and 3 include the first shield 132, the second shield 134, and a third shield 206 in a parallel configuration with the annular mounting flange 136. In some embodiments, the first shield 132 includes a plurality of fastener openings 204 aligned with a plurality of fastener openings 218 in the second shield 134 to accommodate the plurality of fasteners 150 configured to couple the first shield 132 to the second shield 134.

In some embodiments, the plurality of shields 148 are made of a material with an emissivity of about 0.2 or less. In some embodiments, the plurality of shields 148 are made of stainless steel or copper. In some embodiments, one or more of the plurality of shields 148 have a thermally reflective finish. In some embodiments, the plurality of shields 148 are finished with a metal plating, for example, with a coating comprising: nickel, gold, silver, molybdenum, or other thermally reflective materials.

The first shield 132 generally comprises a circular plate, however, other suitable shapes may be used. In some embodiments, the first shield 132 has a curved form, for example, a concave shape, to reflect thermal radiation away from the pump 190. In some embodiments, the first shield 132 has a concave shape with an outer edge 268 of the first shield 132 extending away from the second shield 134. In some embodiments, an outer diameter of the first shield 132 is less than a diameter of a front opening of the pump port 108, the front opening being an opening closest to the substrate support 135. In some embodiments, the first shield 132 includes one or more openings 256 in a central region 258 to facilitate coupling the first shield 132 to other components of the heat shield assembly 118

The second shield 134 generally comprises an annular or ring-shaped plate, having a central opening 202. The central opening 202 provides a gas flow path therethrough to promote flow conductance, while the annular plate provides additional heat protection for the pump 190. The second shield 134 has an outer diameter greater than an outer diameter of the first shield 132. In some embodiments, the central opening 202 has a diameter smaller than an outer diameter of the first shield 132. In some embodiments, the plurality of shields 148 are sized so that there is no open line of sight from the substrate support 135 to the pump port 108. In some embodiments, the second shield 134 has an outer diameter greater than the front opening of the pump port 108. In some embodiments, the second shield 134 is made of a same material as the first shield 132.

In some embodiments, the third shield 206 is coupled to and in a parallel configuration with the second shield 134. In some embodiments, the outer diameter of the third shield 206 is greater than the diameter of the central opening 202 of the second shield 134. In some embodiments, the third shield 206 is made of a same material as the first shield 132. In some embodiments, the third shield 206 is made of two parts that, when coupled together, form a central opening (e.g., central opening 450) of the third shield 206. The central opening 450 is sized to accommodate the support member 122 that passes through the central opening 450. For example, the third shield 206 may include a first part 320 and a second part 322. In some embodiments, the first part 320 includes a first slot 326 and the second part 322 includes a second slot 328 such that when the first part 320 and the second part 322 overlap, the first slot 326 and the second slot 328 form the central opening (see central opening 450). In some embodiments, the first part 320 includes one or more openings 332 aligned with one or more openings 330 of the second part 322 to facilitate coupling the first part 320 to the second part 322. In some embodiments, each of the first part 320 and the second part 322 define at least a portion of an outer edge of the third shield 206. In some embodiments, the third shield 206 has a circular shape. In some embodiments, the third shield 206 has a flat profile. In some embodiments, the third shield 206 has a curved profile.

The annular mounting flange 136 may include a plurality of mounting holes 208 equally spaced along a bolt circle. In some embodiments, one or more grooves 216 are provided in the annular mounting flange 136. In some embodiments, the one or more grooves 216 are disposed radially inward of the mounting holes 208. The one or more grooves 216 may be configured for receiving respective seal rings (e.g., seal rings 410). The support member 122 is generally fabricated from a material having good thermal conductance, for example, copper or stainless steel. The support member 122 advantageously supports the plurality of shields 148 while minimizing the projected area obstructing the flow path of the gases passing through the pump port 108.

In some embodiments, the support member 122 comprises a cross member 232, a support rod 334 and a mounting block 336. The cross member 232 is coupled on opposing ends to the annular mounting flange 136 and may extend co-linearly with a diameter of the annular mounting flange 136 that is generally circular. In some embodiments, the support rod 334 extends perpendicularly from the cross member 232, for example, midway between the end of the cross member 232, and terminates at the mounting block 336. The mounting block 336 is generally rectangular in shape and includes a slot 338 positioned opposite the connection of the mounting block 336 with the support rod 334. In some embodiments, the mounting block 336 additionally has a plurality of holes running through the mounting block 336 orthogonal to and spaced about the slot 338.

In some embodiments, the support member 122 includes a second mounting block 342 sized to fit and be retained in the slot 338 of the mounting block 336. The second mounting block 342 may include a plurality of holes 348 running through the second mounting block 342 and aligned with the plurality of holes of the mounting block 336 so that a pin or fastener (e.g., pin 418) may extend through the plurality of holes of the mounting block 336 and the second mounting block 342 to couple the second mounting block 342 to the mounting block 336. The second mounting block 342 may include one or more openings 344 orthogonal to the plurality of holes 348 and aligned with the one or more openings 256 of the first shield 132 to facilitate coupling the first shield 132 to the second mounting block 342 and thereby, the mounting block 336.

Figure 4:
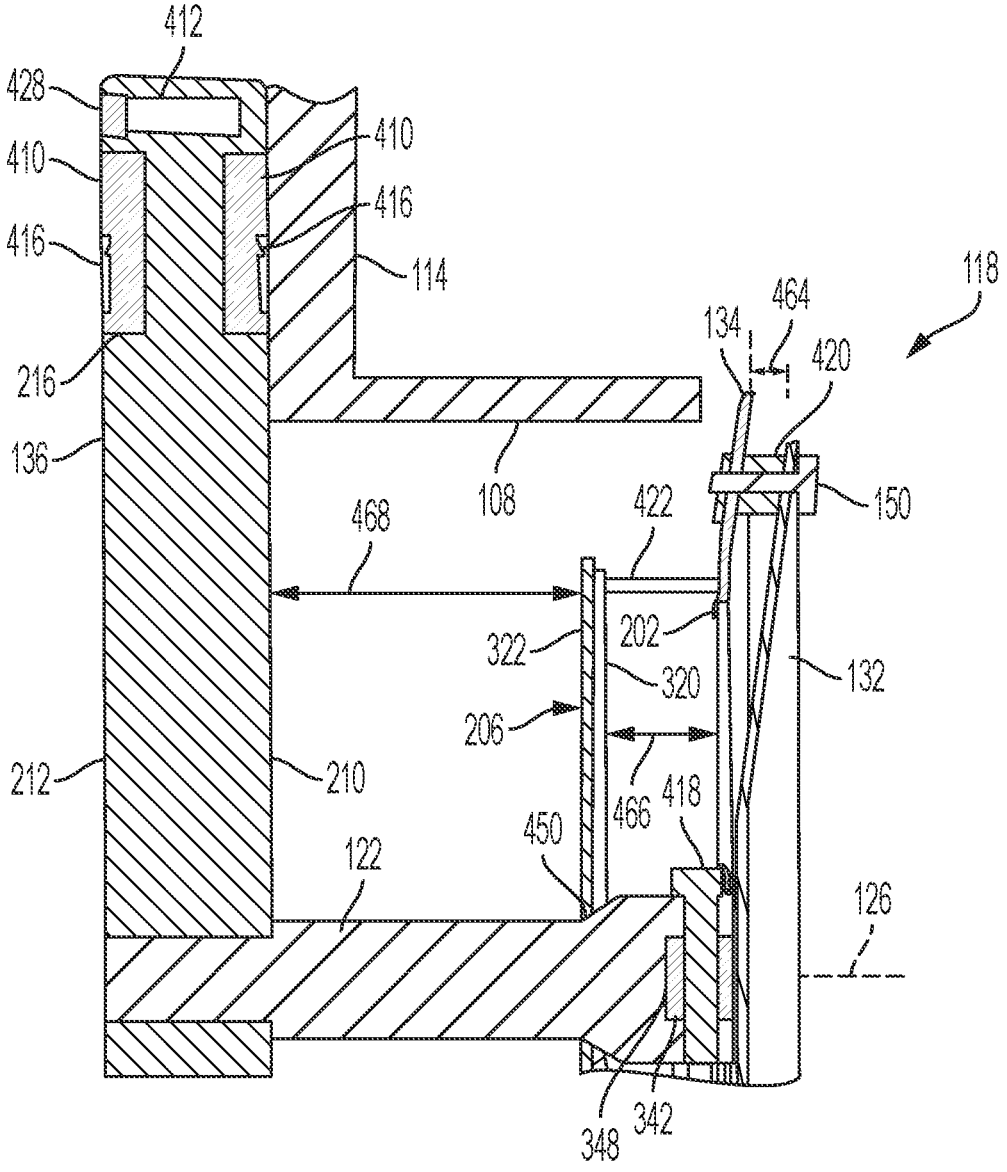
FIG. 4 depicts a cross-sectional side view of a portion of a heat shield assembly in accordance with at least some embodiments of the present disclosure.

FIG. 4 depicts a cross-sectional side view of a portion of a heat shield assembly 118 in accordance with at least some embodiments of the present disclosure. As described above, a pin 418 may extend through one of the plurality of holes of the mounting block 336 and one of the plurality of holes of the second mounting block 342 to couple the second mounting block 342 to the mounting block 336. Also, as briefly discussed above, the one or more grooves 216 may be configured for receiving respective seal rings 410. For example, a seal ring 410 may be disposed in the outer face 212, the inner face 210, or both the outer face 212 and the inner face 210. The seal rings 410 have a sealing face that is exposed and generally co-planar with the respective ones of the inner face 210 and the outer face 212. The seal rings 410 may be fabricated from a metal material such as stainless steel. A gasket 416 may be disposed between any of the seal rings 410 and an adjacent component to ensure reliable sealing and reuse after disassembly of the heat shield assembly 118 from the process chamber 100. In some embodiments, the gasket 416 is disposed in an annular groove in the seal ring 410. Generally, the material of the seal ring 410 is selected to be harder than the material of the gasket 416. In some embodiments, the seal ring 410 is affixed within the groove 216 by vacuum brazing although other gas tight sealing methods such as adhesives and interference fits may alternately be utilized.

In some embodiments, the annular mounting flange 136 includes a fluid passage 412. In some embodiments, the fluid passage 412 is disposed radially outward of the seal ring 410. In some embodiments, the fluid passage 412 is disposed radially outward of the mounting holes 208. The fluid passage 412 substantially circumscribes the annular mounting flange 136. The fluid passage 412 is coupled to the fluid source 176 (shown in FIG. 1), from which fluid is provided to flow through the fluid passage 412.

The fluid regulates the temperature of the heat shield assembly 118 by drawing heat (or alternately introducing heat, depending upon whether heating or cooling of the heat shield assembly 118 is desired) conducted through the annular mounting flange 136 into the fluid. As the fluid is circulated through the annular mounting flange 136 from the fluid source 176, the amount of heat removed from the heat shield assembly 118 is controlled by changing the fluid, fluid flow rate, or temperature of the fluid, thus permitting the heat shield assembly 118 to be maintained at a predetermined temperature. The fluid, which may be liquid and/or gaseous fluids in some embodiments, is a liquid such as de-ionized water and/or ethylene glycol. Other fluids, such as liquid or gaseous nitrogen or freon, can also be used. In some embodiments, the fluid passage 412 is closed off with a plug 428. For example, as depicted in FIG. 4, the plug 428 is fitted flush with the outer face 212 of the annular mounting flange 136 to form the fluid passage 412.

In some embodiments, the third shield 206 is disposed in the pump port 108 while the first shield 132 is disposed outside of the pump port 108. In some embodiments, the heat shield assembly 118 defines a flow path around an outer edge 268 of the first shield and through the central opening 202 of the second shield and to the pump port. In some embodiments, a horizontal distance between the second shield 134 and the first shield 132, or first distance 464, is about 0.1 to about 0.4 inches. In some embodiments, a horizontal distance between the second shield 134 and the third shield 206, or a second distance 466, is about 0.3 inches to about 1 inch. In some embodiments, the third shield 206 is disposed farther from the second shield 134 than from the first shield 132, or in other words, the first distance 464 is less than the second distance 466. In some embodiments, the second distance 466 is less than a third distance 468 between the third shield 206 and the annular mounting flange 136.

In some embodiments, a plurality of first spacers 420 are disposed between the first shield 132 and the second shield 134. The plurality of first spacers 420 are configured to maintain a spacing between the first shield 132 and the second shield 134. In some embodiments, the plurality of first spacers 420 are tubular elements. In some embodiments, the plurality of first spacers 420 comprise two spacers that are diametrically opposed about the central axis 126. In some embodiments, the plurality of first spacers 420 are disposed about the fasteners 150. In some embodiments, a plurality of second spacers 422 are disposed between the second shield 134 and the third shield 206 to maintain a spacing therebetween. In some embodiments, the plurality of second spacers 422 comprise two spacers that are diametrically opposed about the central axis 126.

Figure 5:
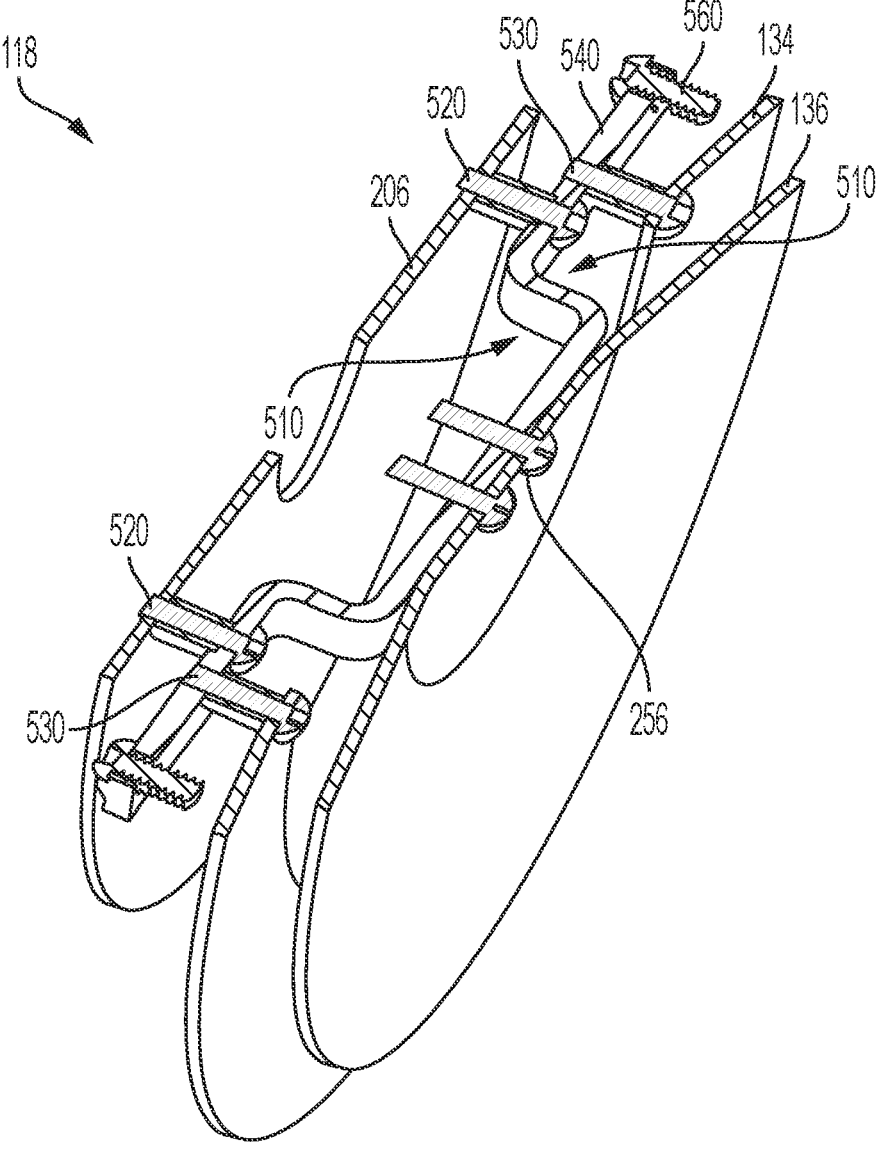
FIG. 5 depicts a cross-sectional isometric view of a heat shield assembly in accordance with at least some embodiments of the present disclosure.

FIG. 5 depicts a cross-sectional isometric view of a heat shield assembly 118 in accordance with at least some embodiments of the present disclosure. FIG. 5 depicts alternative embodiments of how the plurality of shields 148 may be coupled together. For example, in some embodiments, the first shield 132, the second shield 134, and the third shield 206 are all coupled to a mounting bracket 540 disposed between the first shield 132 and the third shield 206. In some embodiments, the first shield 132 is coupled to the mounting bracket 540 via the one or more openings 256 in the central region 258. In some embodiments, the mounting bracket 540 includes one or more bends 510. In some embodiments, the third shield 206 is coupled to the mounting bracket 540 via fasteners 520 at a location radially outward of the one or more openings 256. In some embodiments, the second shield 134 is coupled to the mounting bracket 540 via fasteners 530 at a location radially outward of the location of the fasteners 520. In some embodiments, the mounting bracket 540 may be coupled to the support member 122. In some embodiments, the mounting bracket 540 includes one or more fasteners 560 radially outward of the fasteners 530 for coupling the mounting bracket 540 to a chamber component.

Figure 6:
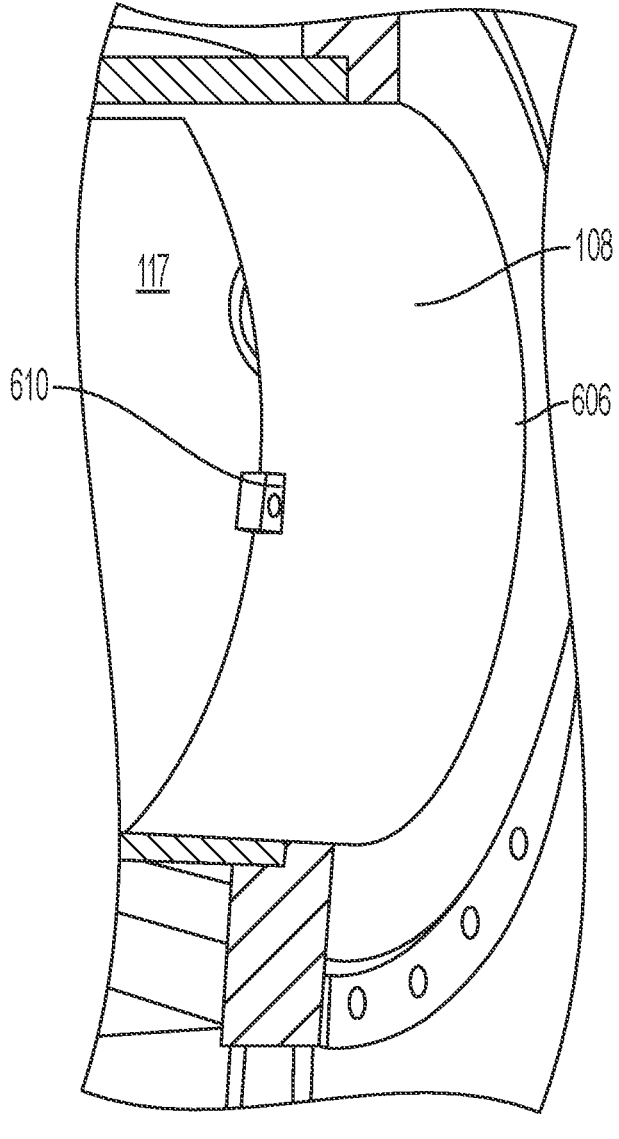
FIG. 6 depicts a cross-sectional isometric view of a pump port in accordance with at least some embodiments of the present disclosure.

FIG. 6 depicts a cross-sectional isometric view of a pump port 108 in accordance with at least some embodiments of the present disclosure. In some embodiments, the pump port 108 includes one or more tabs 610. The one or more tabs 610 generally protrude radially inward from sidewalls 606 of the pump port 108. In some embodiments, the one or more tabs 610 include an opening for accommodating a fastener to couple the mounting bracket 540 to the tab 610. For example, the one or more fasteners 560 of the mounting bracket 540 may be used to couple the mounting bracket 540 to the one or more tabs 610. In such embodiments, the heat shield assembly 118 may not include the annular mounting flange 136 and the support member 122 and instead be coupled to the pump port 108 via the mounting bracket 540 and the tab 610. In such embodiments, the third shield 206 may comprise a single part construction.

While the foregoing is directed to embodiments of the present disclosure, other and further embodiments of the disclosure may be devised without departing from the basic scope thereof.

The invention claimed is:

1. A heat shield assembly for a processing chamber, comprising:
a first shield comprising a circular plate;
a second shield coupled to the first shield and in a parallel configuration with the first shield, wherein the second shield has an outer diameter greater than an outer diameter of the first shield and the second shield includes a central opening having a diameter smaller than an outer diameter of the first shield; and
a third shield coupled to and in a parallel configuration with the second shield, wherein an outer diameter of the third shield is greater than the diameter of the central opening of the second shield, and wherein a central opening of the third shield is smaller than the central opening of the second shield.

2. The heat shield assembly of claim 1, wherein the first shield has a concave shape.

3. The heat shield assembly of claim 1, further comprising an annular mounting flange disposed in a parallel configuration with the first shield and coupled to the first shield via a support member extending from a central axis of the annular mounting flange.

4. The heat shield assembly of claim 3, wherein the annular mounting flange includes a fluid passage.

5. The heat shield assembly of claim 3, wherein the central opening of the third shield is sized to accommodate the support member such that a flow path extends from around the outer diameter of the first shield, through the central opening of the second shield, and around the outer diameter of the third shield.

6. The heat shield assembly of claim 1, further comprising a plurality of first spacers disposed between the first shield and the second shield, and a plurality of second spacers disposed between the second shield and the third shield.

7. The heat shield assembly of claim 1, wherein the first shield, the second shield, and the third shield are all coupled to a mounting bracket disposed between the first shield and the third shield and in the central opening of the second shield.

8. The heat shield assembly of claim 1, further comprising:
an annular mounting flange disposed in a parallel configuration with the first shield and coupled to the first shield via a support member extending from a central axis of the annular mounting flange;
a plurality of first spacers disposed between the first shield and the second shield, wherein the first shield is coupled to the second shield via fasteners that extend through the plurality of first spacers; and
plurality of second spacers disposed between the second shield and the third shield.

9. The heat shield assembly of claim 1, wherein the first shield, the second shield, and the third shield are made of a material with an emissivity of about 0.2 or less.

10. A heat shield assembly for a processing chamber, comprising:
a plurality of shields arranged in a parallel configuration, wherein a first shield of the plurality of shields comprises a circular plate, wherein a second shield of the plurality of shields has an outer diameter greater than an outer diameter of the first shield and the second shield includes a central opening having a diameter smaller than an outer diameter of the first shield; and a bracket, wherein the bracket is coupled to a central region of the first shield and a peripheral region of the second shield.

11. The heat shield assembly of claim 10, further comprising a third shield of the plurality of shields, wherein the third shield is disposed farther from the second shield than from the first shield.

12. The heat shield assembly of claim 11, wherein the third shield is made of two parts that, when coupled together, form a central opening of the third shield to accommodate a support member.

13. The heat shield assembly of claim 10, wherein the first shield has a concave shape with an outer edge of the first shield extending away from the second shield.

14. The heat shield assembly of claim 10, wherein at least one of:

the first shield and the second shield are coupled to a mounting bracket, or the first shield is directly coupled to the second shield along an outer peripheral region of the first shield via a plurality of fasteners.

15. A processing chamber, comprising:

a chamber body defining an interior volume therein, wherein the chamber body includes a pump port configured for coupling the chamber body to a pump;

a substrate support disposed in the interior volume and configured to support a substrate; and a heat shield assembly disposed in the interior volume proximate the pump port and substantially covering the pump port, the heat shield assembly comprising:

a plurality of shields arranged in a parallel configuration, wherein a first shield of the plurality of shields comprises a circular plate, wherein a second shield of the plurality of shields has an outer diameter greater than an outer diameter of the first shield and the second shield includes a central opening having a diameter smaller than an outer diameter of the first shield, and wherein a third shield of the plurality of shields is a plate that has an outer diameter greater than a diameter of the central opening of the second shield.

16. The processing chamber of claim 15, wherein the heat shield assembly defines a flow path around an outer edge of the first shield and through the central opening of the second shield and around the outer diameter of the third shield to the pump port.

17. The processing chamber of claim 15, further comprising a cryogenic pump coupled to the pump port.

18. The processing chamber of claim 15, wherein the third shield is disposed in the pump port, and wherein the first shield is disposed outside of the pump port.

19. The processing chamber of claim 15, wherein the pump port includes a tab, and wherein the heat shield assembly is coupled to the pump port via the tab.

20. The processing chamber of claim 15, wherein the heat shield assembly further comprises an annular mounting flange coupled to the chamber body.

* * * * *